United States Patent
Miura

(10) Patent No.: US 10,287,675 B2
(45) Date of Patent: May 14, 2019

(54) FILM DEPOSITION METHOD

(71) Applicant: Tokyo Electron Limited, Tokyo (JP)

(72) Inventor: Shigehiro Miura, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/407,545

(22) Filed: Jan. 17, 2017

(65) Prior Publication Data

US 2017/0218516 A1    Aug. 3, 2017

(30) Foreign Application Priority Data

Jan. 29, 2016  (JP) ................................. 2016-015490

(51) Int. Cl.
*H05H 1/46* (2006.01)
*C23C 16/40* (2006.01)
(Continued)

(52) U.S. Cl.
CPC ...... *C23C 16/402* (2013.01); *C23C 16/45536* (2013.01); *C23C 16/45551* (2013.01);
(Continued)

(58) Field of Classification Search
CPC ..... C23C 16/40; C23C 16/401; C23C 16/402; C23C 16/45527; C23C 16/45534; C23C 16/45536; C23C 16/4554; C23C 16/45542; C23C 16/45544; C23C 16/45548; C23C 16/45551; C23C 16/45553; C23C 16/45555; C23C 16/4584;
(Continued)

(56) References Cited

U.S. PATENT DOCUMENTS 7,981,815 B2   7/2011  Miya et al.
8,431,494 B2 *  4/2013  Murakami ........ C23C 16/45523
                                                257/E21.274
(Continued)

FOREIGN PATENT DOCUMENTS

JP    2007-042884    2/2007
JP    2009-212303    9/2009
(Continued)

OTHER PUBLICATIONS

Machine translation of JP 2010-239103 A, by Kato Hisashi et al.; published Oct. 21, 2010 (translation from eSpaceNet & is complete).*

*Primary Examiner* — Marianne L Padgett
(74) *Attorney, Agent, or Firm* — IPUSA, PLLC

(57) ABSTRACT

A film deposition method for forming a film of a reaction product includes adsorbing a first process gas to a surface of a substrate; reacting the first process gas and a second process gas to generate a reaction product; and modifying a surface of the reaction product by plasma activating a plasma processing gas and supplying the plasma processing gas to the substrate, wherein in the modifying the surface of the reaction product, a first plasma processing gas is supplied to form a flow of the first plasma processing gas in a direction parallel to the surface of the substrate over an entire surface of the substrate, and also a second plasma processing gas containing hydrogen containing gas is supplied at an upstream side of the flow of the first plasma processing gas in the direction parallel to the surface of the substrate.

13 Claims, 11 Drawing Sheets

(51) Int. Cl.
*C23C 16/455* (2006.01)
*H01J 37/32* (2006.01)

(52) U.S. Cl.
CPC .. *C23C 16/45574* (2013.01); *C23C 16/45578* (2013.01); *H01J 37/32449* (2013.01); *H01J 37/32651* (2013.01)

(58) Field of Classification Search
CPC . C23C 16/50–16/517; C23C 16/45574; C23C 16/45578; H01J 37/3244; H01J 37/32715; H01J 37/32733; H01J 37/32752; H01J 37/32761; H01J 37/32779; H01J 2237/332; H01J 2237/3321; H01J 2237/338; H01J 37/32449
USPC ..... 427/489, 536, 537, 539, 255.15, 255.18, 427/255.19–255.22; 118/719, 732 E, 730
See application file for complete search history.

(56) References Cited

U.S. PATENT DOCUMENTS

| | | | | |
|---|---|---|---|---|
| 8,642,487 B2* | 2/2014 | Kato | ............. | H01L 21/02274 257/E21.463 |
| 8,835,332 B2* | 9/2014 | Kato | ............. | H01L 21/30 438/787 |
| 9,023,738 B2* | 5/2015 | Kato | ............. | H01L 21/30 438/787 |
| 10,062,564 B2* | 8/2018 | Tapily | ............. | H01L 21/02315 |
| 10,151,031 B2* | 12/2018 | Kato | ............. | C23C 16/4584 |
| 2004/0129212 A1* | 7/2004 | Gadgil | ............. | C23C 16/452 118/715 |
| 2005/0032372 A1 | 2/2005 | Ko et al. | | |
| 2008/0242097 A1 | 10/2008 | Boescke et al. | | |
| 2009/0053906 A1 | 2/2009 | Miya et al. | | |
| 2010/0055347 A1* | 3/2010 | Kato | ............. | C23C 16/452 427/569 |
| 2011/0155057 A1* | 6/2011 | Kato | ............. | C23C 16/45519 118/719 |
| 2011/0312192 A1* | 12/2011 | Murakami | ............. | C23C 16/401 438/787 |
| 2013/0059415 A1* | 3/2013 | Kato | ............. | C23C 16/345 438/106 |
| 2013/0130512 A1* | 5/2013 | Kato | ............. | H01L 21/02274 438/765 |
| 2013/0164942 A1* | 6/2013 | Kato | ............. | H01L 21/30 438/758 |
| 2015/0104574 A1* | 4/2015 | Lee | ............. | C23C 16/402 427/255.28 |
| 2017/0167019 A1* | 6/2017 | Hasebe | ............. | C23C 16/45544 |
| 2017/0338099 A1* | 11/2017 | Miura | ............. | C23C 16/402 |

FOREIGN PATENT DOCUMENTS

| | | |
|---|---|---|
| JP | 2010-239103 | 10/2010 |
| JP | 2011-054742 | 3/2011 |
| JP | 2011-216862 | 10/2011 |
| JP | 2013-135154 | 7/2013 |
| WO | 2008/010546 | 1/2008 |

* cited by examiner

FILM DEPOSITION METHOD

CROSS-REFERENCE TO RELATED APPLICATION

The present application is based on and claims the benefit of priority of Japanese Priority Application No. 2016-015490 filed on Jan. 29, 2016, the entire contents of which are hereby incorporated by reference.

BACKGROUND OF THE INVENTION

1. Field of the Invention

The present invention relates to a film deposition method.

2. Description of the Related Art

Conventionally, a film deposition apparatus is known in which a plurality of substrates are mounted on a turntable provided in a vacuum chamber in a rotational direction of the turntable, and a film is formed on each of the substrates by supplying a reaction gas from a gas supply part provided to extend along a radial direction of the turntable while rotating the turntable (see Patent Document 1, for example).

In this film deposition apparatus, a film of a reaction product is formed by repeating a step of adsorbing a first process gas on the substrate, a step of generating a reaction product by reacting the adsorbed first process gas and a second process gas, and a step of modifying the reaction product by plasma, in this order.

Here, as an aspect ratio of a trench of a trench device structure becomes larger in accordance with miniaturization of a circuit pattern, when filling the film of the reaction product in the trench in the film deposition apparatus, there is a case that a void is generated in the film of the reaction product filled in the trench.

Thus, conventionally, a method is known in which a silicon oxide film is filled in a concave portion such as a trench by reacting organic aminosilane gas, which easily adsorbs to a hydroxyl group (OH group), and oxide gas (see Patent Document 2, for example).

According to this method, OH groups are generated at a surface of the silicon oxide film when oxidizing the organic aminosilane gas by the oxide gas. Then, by supplying a plasma activated process gas to the silicon oxide film in the step of modifying, the OH groups adsorbed to the surface of the silicon oxide film are distributed such that its density is high at a bottom of the trench and its density becomes lower toward an opening of the trench. With this, the silicon oxide film is formed such that its thickness becomes thinner from the bottom of the trench toward the opening (bottom up deposition). Thus, generation of the void in the silicon oxide film filled in the trench can be suppressed.

However, according to the above described method, it is difficult to control the distribution of the OH groups in the step of modifying. Specifically, when the plasma activated process gas is supplied to the silicon oxide film in the step of modifying, the OH groups are removed from the surface of the silicon oxide film, and the removed OH groups are distributed downstream along a flow of the process gas.

In particular, when forming the silicon oxide film in the concave portion of the substrate, the amount of the OH groups that are removed from the surface of the silicon oxide film and distributed downstream along the flow of the process gas becomes large. This is because, when a pattern including a concave portion is formed, compared with a case when such a pattern is not formed, a surface area of the silicon oxide film becomes large and the amount of the OH groups adsorbed to the surface of the silicon oxide film becomes also large.

If the removed OH groups diffuse downstream of the flow of the process gas, the OH groups adsorb to the surface of the silicon oxide film at a downstream side again and the amount of the absorbed OH groups at the downstream side becomes larger than the amount of the adsorbed OH groups at an upstream side. With this, the organic aminosilane gas easily adsorbs to the substrate at the downstream side of the flow of the process gas in the step of adsorbing the organic aminosilane gas, which is performed subsequent to the step of modifying. Thus, the thickness of the silicon oxide film becomes non-uniform such that the thickness of the silicon oxide film at the downstream side of the flow of the process gas on the substrate becomes thicker than the thickness of the silicon oxide film at the upstream side of the flow of the process gas on the substrate.

Therefore, a film deposition method capable of improving in-plane uniformity of the thickness of a film formed on a substrate is required.

PATENT DOCUMENTS

[Patent Document 1] Japanese Laid-open Patent Publication No. 2010-239103

[Patent Document 2] Japanese Laid-open Patent Publication No. 2013-135154

SUMMARY OF THE INVENTION

According to an embodiment, there is provided a film deposition method for forming a film of a reaction product of a first process gas capable of adsorbing to a hydroxyl group, and a second process gas capable of reacting with the first process gas, including adsorbing the first process gas to a surface of a substrate by supplying the first process gas to the surface of the substrate; reacting the first process gas and the second process gas to generate the reaction product by supplying the second process gas to the substrate to which the first process gas is adsorbed; and modifying a surface of the reaction product by plasma activating a plasma processing gas and supplying the plasma activated plasma processing gas to the substrate, wherein in the modifying the surface of the reaction product, a first plasma processing gas is supplied to form a flow of the first plasma processing gas in a direction parallel to the surface of the substrate over an entire surface of the substrate, and also a second plasma processing gas containing hydrogen containing gas is supplied at an upstream side of the flow of the first plasma processing gas in the direction parallel to the surface of the substrate.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

Figure 1:
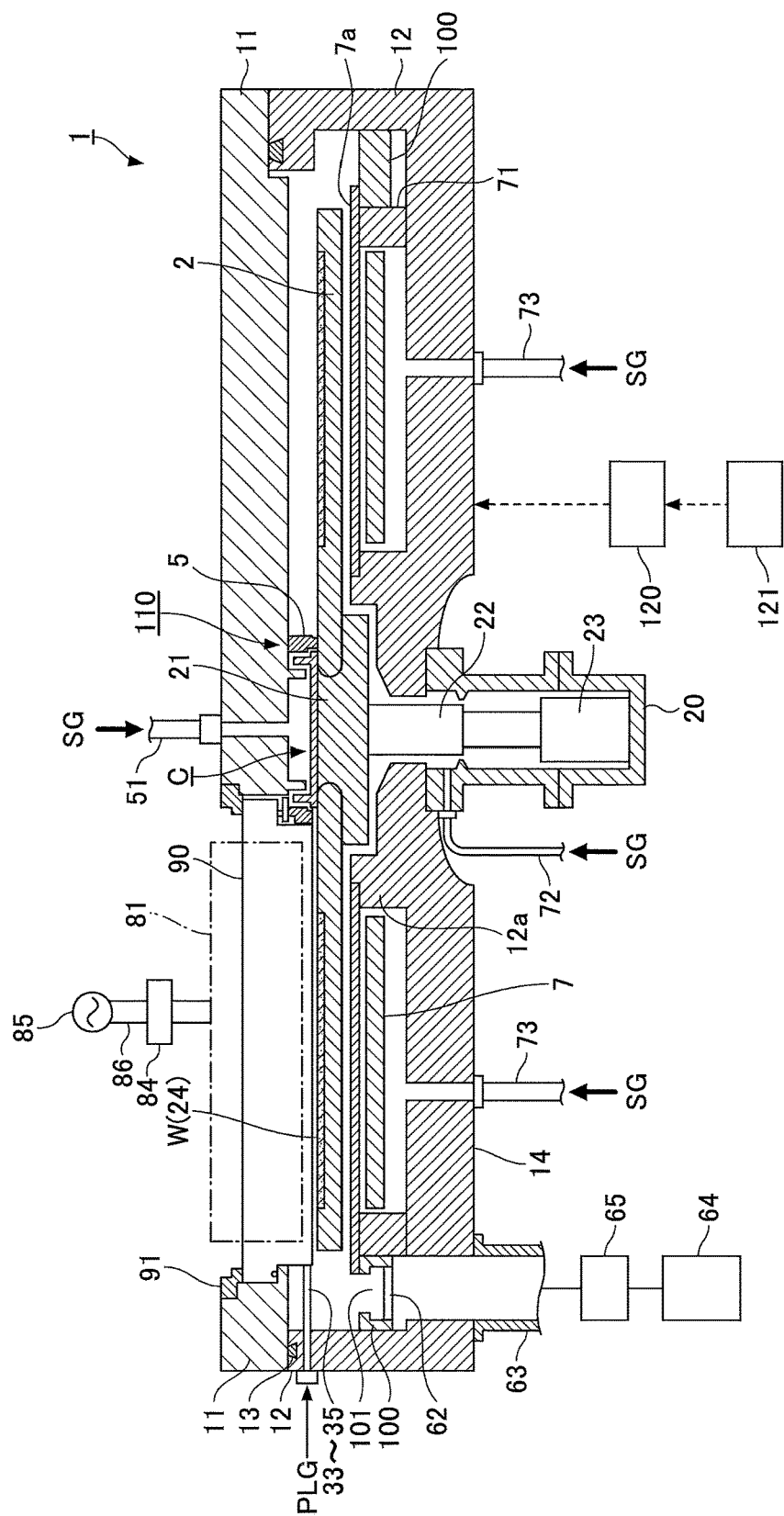
FIG. 1 is a schematic vertical cross-sectional view illustrating an example of a film deposition apparatus of an embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

(Film Deposition Apparatus)

Figure 2:
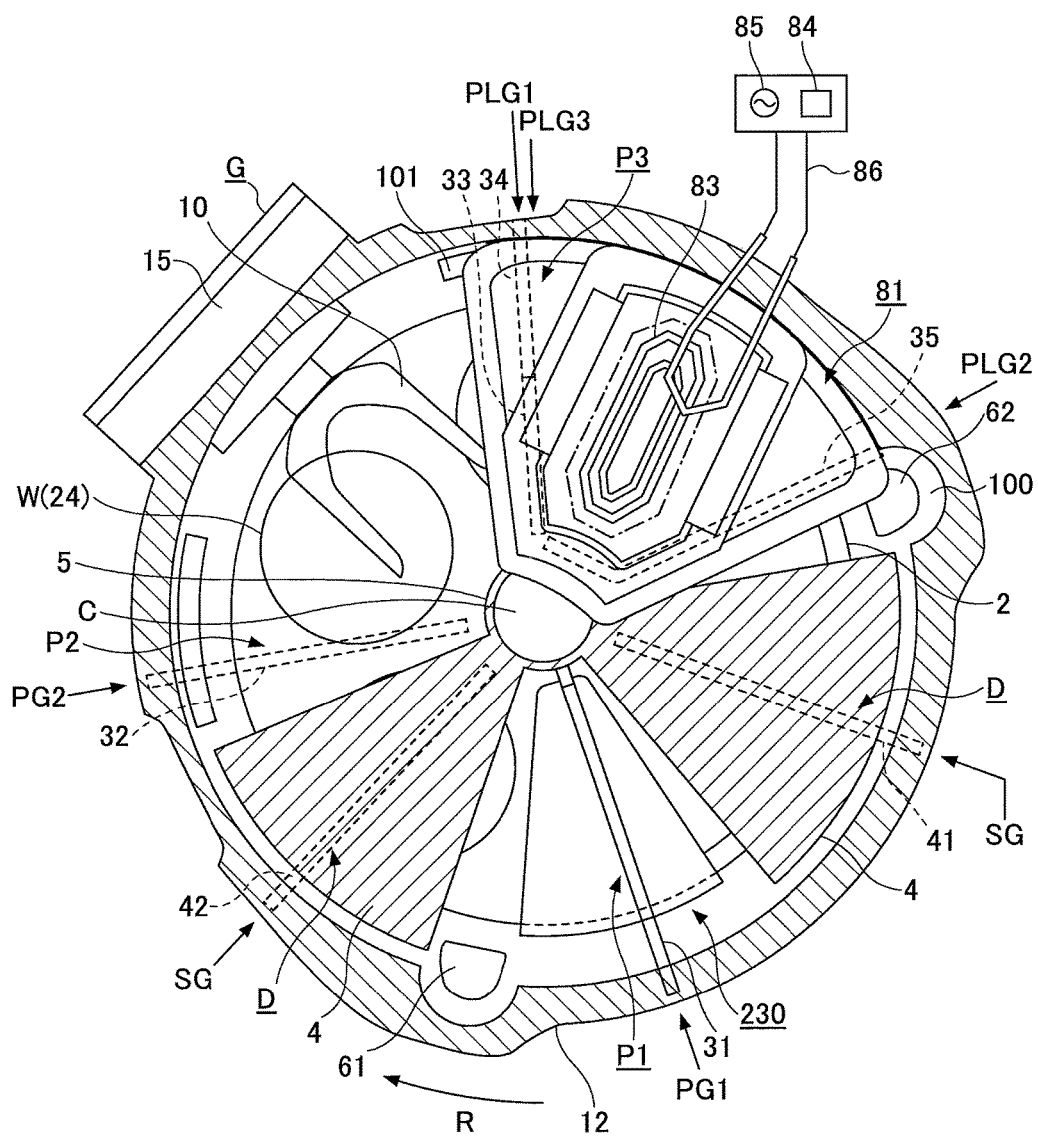
FIG. 2 is a schematic plan view illustrating an example of the film deposition apparatus of the embodiment.

A film deposition apparatus of the embodiment is described with reference to FIG. 1 to FIG. 10. FIG. 1 is a schematic vertical cross-sectional view illustrating an example of the film deposition apparatus of the embodiment. FIG. 2 is a schematic plan view illustrating an example of the film deposition apparatus of the embodiment.

As illustrated in FIG. 1, the film deposition apparatus of the embodiment includes a vacuum chamber 1 having a substantially circular planar shape, and a turntable 2 that is provided in the vacuum chamber 1 such that a rotational center of the turntable 2 coincides with a center of the vacuum chamber 1. The turntable 2 rotates semiconductor wafers (hereinafter, referred to as "wafers W") placed thereon by rotating around its rotational center. The wafer W is an example of a substrate.

The vacuum chamber 1 is a process chamber to accommodate the wafers W therein and to deposit films on surfaces of the wafers W. The vacuum chamber 1 includes a top plate 11 and a chamber body 12. A ring-shaped seal member 13 is provided at the periphery of an upper surface of the chamber body 12. The top plate 11 is configured to be attachable to and detachable from the chamber body 12. The diameter (inside diameter) of the vacuum chamber 1 in a plan view is, for example, but is not limited to, about 1100 mm. Here, the top plate 11 is not illustrated in FIG. 2 for explanation purposes.

A separation gas supply pipe 51 is connected to a center of an upper side of the vacuum chamber 1. The separation gas supply pipe 51 supplies a separation gas SG to a central area C in the vacuum chamber 1 to prevent different process gasses from mixing with each other in the central area C.

A central part of the turntable 2 is fixed to an approximately-cylindrical core portion 21. A rotational shaft 22 is connected to a lower surface of the core portion 21 and extends in the vertical direction. The turntable 2 is configured to be rotatable by a drive unit 23 around a vertical axis of the rotational shaft 22, in a clockwise fashion (in a rotational direction R) in the example of FIG. 2. The diameter of the turntable 2 is, for example, but is not limited to, about 1000 mm.

The rotational shaft 22 and the drive unit 23 are housed in a case body 20. An upper-side flange of the case body 20 is hermetically attached to a lower surface of a bottom surface portion 14 of the vacuum chamber 1. A purge gas supply pipe 72 for supplying a purge gas (separation gas SG) such as nitrogen ($N_2$) gas to an area below the turntable 2 is connected to the case body 20.

A part of the bottom surface portion 14 of the vacuum chamber 1 surrounding the core portion 21 forms a ring-shaped protrusion 12a that protrudes so as to approach the turntable 2 from a lower side.

A heater unit 7, as a heating mechanism, is provided in a space between the turntable 2 and the bottom surface portion 14 of the vacuum chamber 1. The heater unit 7 is configured to heat the wafers W on the turntable 2 through the turntable 2 to a temperature in a range from about room temperature to about 400° C., for example. A side covering member 71 is provided on a lateral side of the heater unit 7, and an upper covering member 7a that covers the heater unit 7 is provided above the heater unit 7. Purge gas supply pipes 73 are provided at the bottom surface portion 14 of the vacuum chamber 1 below the heater unit 7. The purge gas supply pipes 73 are arranged at a plurality of locations along the circumferential direction, and used to purge the space where the heater unit 7 is placed.

Circular concave portions 24 where the wafers W having a diameter of, for example, 300 mm are placed, are formed at the upper surface of the turntable 2. A plurality, for example, six, of the concave portions 24 are formed along the rotational direction R of the turntable 2. Each of the concave portions 24 has an inner diameter that is slightly, specifically, from about 1 mm to 4 mm, greater than the diameter of the wafer W. Further, the depth of the concave portion 24 is substantially the same as or greater than or equal to the thickness of the wafer W. Accordingly, when the wafer W is placed in the concave portion 24, the height of the upper surface of the wafer W becomes substantially the same as or lower than the height of the upper surface of the turntable 2 where the wafers W are not placed. When the depth of the concave portion 24 is excessively greater than the thickness of the wafer W, it may adversely affect film deposition. Therefore, the depth of the concave portion 24 is preferably less than or equal to about three times of the thickness of the wafer W. Through holes (not illustrated in the drawings) are formed at the bottom of the concave portion 24 to allow a plurality of (e.g., three) lifting pins (which are described later) to pass through. The lifting pins raise and lower the wafer W.

As illustrated in FIG. 2, a transfer opening 15 is formed at a side wall of the vacuum chamber 1 for passing the wafer W between the transfer arm 10 and the turntable 2. A gate valve G is provided to hermetically open and close the transfer opening 15.

The wafer W is transferred between the concave portion 24 of the turntable 2 and the transfer arm 10 when the concave portion 24 is at a position facing the transfer opening 15. For this reason, the lifting pins and an elevating mechanism (not illustrated in the drawings) for lifting the wafer W are provided at the transfer position under the turntable 2. The lifting pins pass through the concave portion 24 and push the back surface of the wafer W upward.

A first process area P1, a separation area D, a second process area P2, a plasma process area P3 and a separation area D are formed above the turntable 2 in the vacuum chamber 1 in this order in the rotational direction R of the turntable 2. A plurality of (e.g., seven) gas nozzles 31, 42, 32, 33 (and 34), 35 and 41, made of quartz, for example, are arranged at the areas, respectively, with intervals in a circumferential direction of the vacuum chamber 1. The gas nozzles 31, 42, 32, 33 (and 34), 35 and 41 are provided to extend radially and are disposed to face areas that the concave portions 24 of the turntable 2 pass through. The gas nozzles 31, 42, 32, 33, 34, 35 and 41 are placed between the turntable 2 and the top plate 11. Among them, the gas nozzles 31, 42, 32, 33, 35 and 41 are disposed such that the distance between a lower end edge of each of the gas nozzles 31, 42, 32, 33, 35 and 41, and an upper surface of the turntable 2 is about 1 to 5 mm, for example. Further, among them, each of the gas nozzles 31, 42, 32, 33 and 41 extends horizontally from an outer wall of the vacuum chamber 1 toward the central area C so as to face the wafers W, for example.

Each of the gas nozzles 31, 42, 32, 33, 34, 35 and 41 is connected to a respective gas supply source (not illustrated in the drawings) via a respective flow control valve.

Specifically, the first process gas nozzle 31 is provided at the first process area P1, and the second process gas nozzle 32 is provided at the second process area P2. The first process gas nozzle 31 supplies a first process gas PG1. The first process area P1 that is positioned below the first process gas nozzle 31 is an area for adsorbing the first process gas PG1 (silicon containing gas, for example) to the wafer W. The second process gas nozzle 32 supplies a second process gas PG2. The second process area P2 that is positioned below the second process gas nozzle 32 is an area for reacting the first process gas PG1 adsorbed to the wafer W with the second process gas PG2 (oxide gas, for example) to generate a reaction product.

Further, the separation gas nozzle 42 and the separation gas nozzle 41 are provided at the two separation areas D, respectively. The separation gas nozzle 42 and the separation gas nozzle 41 supply a separation gas SG, respectively. The separation gas nozzle 42 and the separation gas nozzle 41 are provided to form the separation areas D that separate the first process area P1, the second process area P2 and the like by supplying the separation gas SG. As the separation gas SG, a noble gas such as helium (He) gas or argon (Ar) gas, or an inert gas such as $N_2$ gas may be used.

Figure 3:
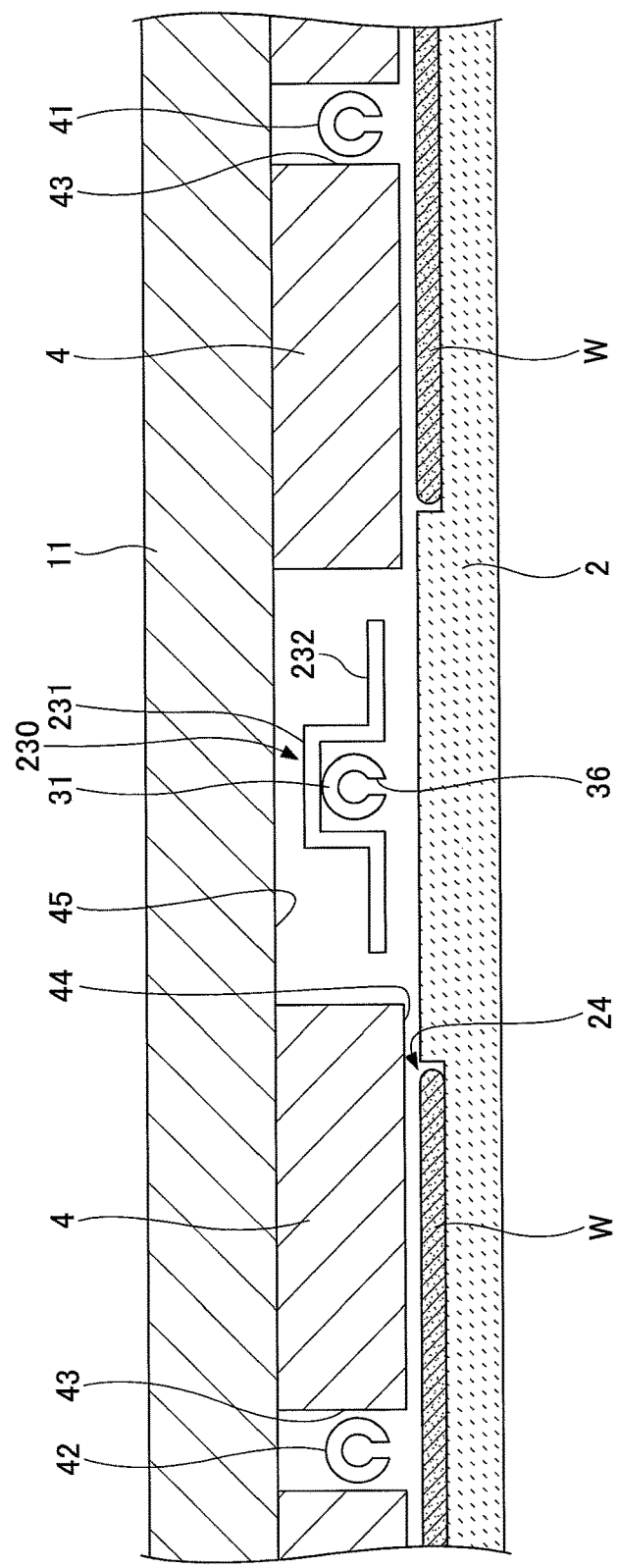
FIG. 3 is a cross-sectional view illustrating an example of the film deposition apparatus of the embodiment taken along a concentric circle of the turntable.

FIG. 3 is a cross-sectional view illustrating an example of the film deposition apparatus of the embodiment taken along a concentric circle of the turntable 2. FIG. 3 illustrates a cross-sectional view from the separation area D to another separation area D through the first process area P1.

Gas discharge holes 36 for discharging a gas are formed at the lower surface (the side facing the turntable 2) of each of the first process gas nozzle 31, the separation gas nozzle 42 and the separation gas nozzle 41 at regular intervals along the radial direction of the turntable 2, for example. Gas discharge holes 36 are similarly formed at the second process gas nozzle 32.

Approximately sectorial convex portions 4 are provided on the lower surface of the top plate 11 of the vacuum chamber 1 at locations corresponding to the separation areas D. The convex portions 4 are attached to the back surface of the top plate 11. In the vacuum chamber 1, flat and low ceiling surfaces 44 (first ceiling surfaces) are formed by the lower surfaces of the convex portions 4, and ceiling surfaces 45 (second ceiling surfaces) are formed by the lower surface of the top plate 11. The ceiling surfaces 45 are located on both sides of the ceiling surfaces 44 in the circumferential direction, and are located higher than the ceiling surfaces 44.

As illustrated in FIG. 2, each of the convex portions 4 forming the ceiling surface 44 has a sectorial planar shape whose apex is cut off to form an arc-shaped side. Also, a groove 43 extending in the radial direction is formed in each of the convex portions 4 at the center in the circumferential direction. Each of the separation gas nozzles 41 and 42 is placed in the respective groove 43. A peripheral portion of the convex portion 4 (a portion along the outer edge of the vacuum chamber 1) is bent to form an L-shape (not illustrated in the drawings) to prevent the process gases from mixing with each other. The L-shaped portion of the convex portion 4 faces the outer end surface of the turntable 2 and is slightly apart from the chamber body 12.

A nozzle cover 230 is provided above the first process gas nozzle 31. The nozzle cover 230 causes the first process gas PG1 to flow along the wafer W, and causes the separation gas SG to flow near the top plate 11 of the vacuum chamber 1 instead of near the wafer W. As illustrated in FIG. 3, the nozzle cover 230 includes a cover 231 and current plates 232. The cover 231 has an approximately-box-shape having an opening at a lower side to accommodate the first process gas nozzle 31. Each of the current plates 232 has a flat plate shape. The current plates 232 are connected to upstream and downstream edges of the opening of the cover 231 in the rotational direction of the turntable 2. A side wall of the cover 231 near the rotational center of the turntable 2 extends toward the turntable 2 to face a front end portion of the first process gas nozzle 31 (not illustrated in the drawings). Further, another side wall of the cover 231 near the outer edge of the turntable 2 is partially cut off so as not to interfere with the first process gas nozzle 31 (not illustrated in the drawings).

Referring back to FIG. 1 and FIG. 2, a base nozzle (first plasma processing gas nozzle), an outer nozzle (third plasma processing gas nozzle) and an axis-side nozzle 35 (second plasma processing gas nozzle) are provided in the plasma process area P3 as plasma processing gas nozzles. In the following, the base nozzle 33, the outer nozzle 34 and the axis-side nozzle 35 may be simply referred to as the plasma processing gas nozzles 33 to 35 as well. A plasma generator 81 is provided above the plasma processing gas nozzles 33 to 35 for plasma activating a plasma processing gas discharged into the vacuum chamber 1. The plasma process area P3 provided below the plasma processing gas nozzles 33 to 35 is an area for modifying a surface of the reaction product formed on the surface of the wafer W by supplying the plasma processing gas (PLG) to the wafer W after being plasma activated. The plasma generator 81 and the plasma processing gas nozzles 33 to 35 are described later.

A side ring 100, which is a cover, is provided along the outer circumference of the turntable 2 and slightly below the turntable 2. Two exhaust opening, for example, a first exhaust opening 61 and a second exhaust opening 62, which are apart from each other in the circumferential direction, are formed at an upper surface of the side ring 100. In other words, the first exhaust opening 61 and the second exhaust opening 62 are formed in the side ring 100 at locations corresponding to two exhaust ports formed at a bottom surface of the vacuum chamber 1.

In this embodiment, the first exhaust opening 61 is formed at a location that is between the first process gas nozzle 31 and the separation area D located downstream of the first process gas nozzle 31 in the rotational direction R of the turntable 2, and is closer to the separation area D than to the first process gas nozzle 31. The second exhaust opening 62 is formed at a location that is between the plasma generator 81 and the separation area D located downstream of the plasma generator 81 in the rotational direction R of the turntable 2, and is closer to the separation area D than to the plasma generator 81.

The first exhaust opening 61 is configured to exhaust the first process gas PG1 and the separation gas SG. The second exhaust opening 62 is configured to exhaust the second process gas PG2, the plasma processing gas PLG and the separation gas SG. Each of the first exhaust opening 61 and the second exhaust opening 62 is connected to a vacuum pump 64 that is an example of an evacuation mechanism through an evacuation pipe 63 including a pressure controller 65 such as a butterfly valve.

Further, as will be described later in detail, the plasma generator 81 includes a housing 90 that is inserted in the inner area extending from the central area C toward the outer wall of the vacuum chamber 1. Thus, gases flowing from the upstream in the rotational direction R of the turntable 2 to the plasma process area P3 and then flowing toward the second exhaust opening 62 may be blocked by the housing 90. For this reason, a groove-like gas flow passage 101 to allow the gases to flow therethrough is formed at the upper surface of the side ring 100 at a location closer to the outer wall of the vacuum chamber 1 than the outer end of the housing 90.

A protruding portion 5 having a substantially ring shape is formed on a central part of the lower surface of the top plate 11. The protruding portion 5 is continuously formed from the portions at the central area C of the convex portion 4 in a substantially ring shape in a circumferential direction. The height of the lower surface of the protruding portion 5 is substantially the same as the height of the lower surfaces (the ceiling surfaces 44) of the convex portions 4. A labyrinth structure 110 is formed above the core portion 21 at a location closer to the rotational center of the turntable 2 than the protruding portion 5. The labyrinth structure 110 prevents gases from mixing with each other in the central area C.

As the housing 90 is formed at a location near the central area C, the core portion 21 that supports the center part of the turntable 2 is formed near the rotational center area such that the portion above the turntable 2 avoids the interference with the housing 90. With this configuration, various gasses are easily mixed at the central area C than at the outer edge area. Thus, by forming the labyrinth structure 110 at the upper side of the core portion 21, the gas flow passage can be extended and the gasses are prevented from being mixed with each other.

Further, as illustrated in FIG. 1, the film deposition apparatus of the embodiment includes a control unit 120 implemented by a computer for controlling the operations of the entire film deposition apparatus. The control unit 120 includes a memory that stores a program for causing the film deposition apparatus to perform a film deposition method described later under a control by the control unit 120. The program may include steps for causing the film deposition apparatus to perform the film deposition method described later. The program may be stored in a storage unit 121 that forms a storage medium such as a hard disk, and installed from the storage unit 121 into the control unit 120.

Figure 4:
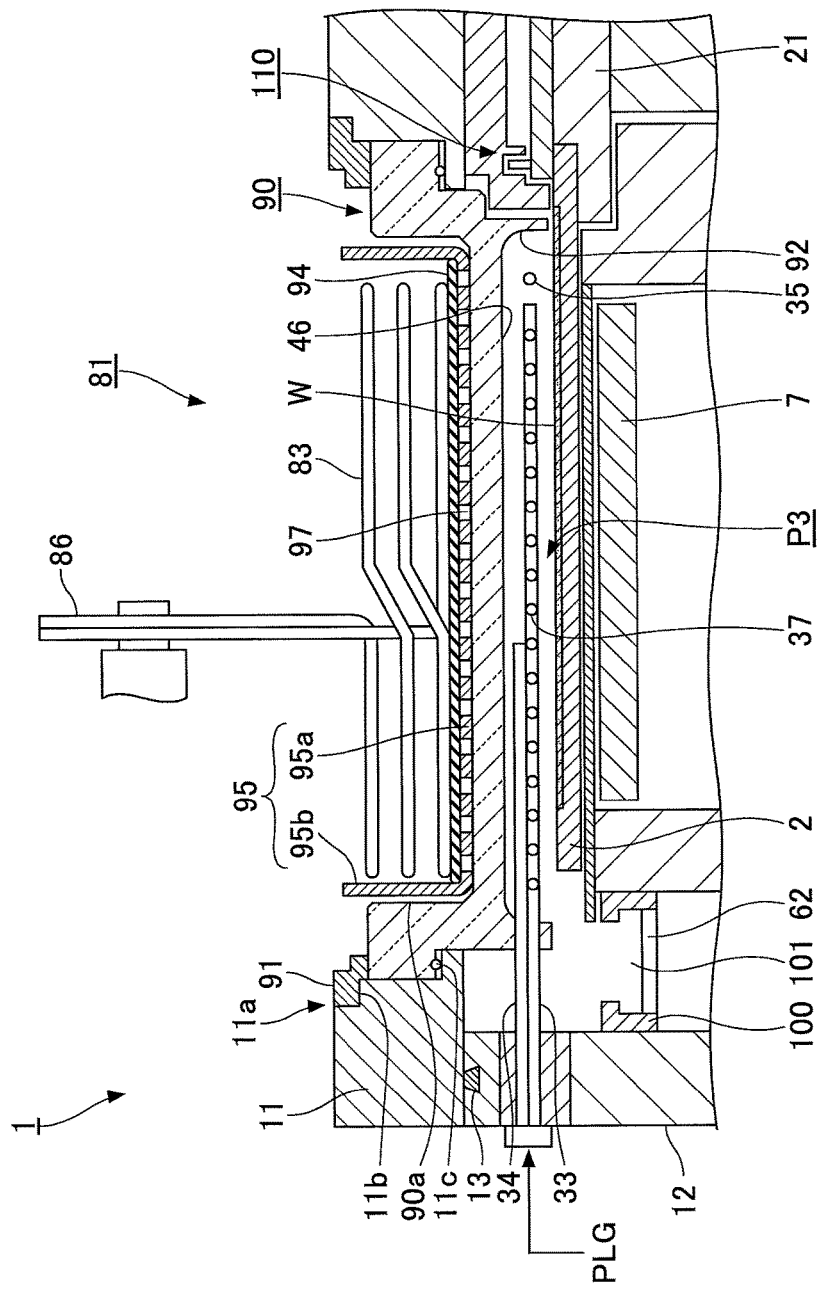
FIG. 4 is a vertical cross-sectional view illustrating an example of a plasma generator of the film deposition apparatus of the embodiment.
Figure 5:
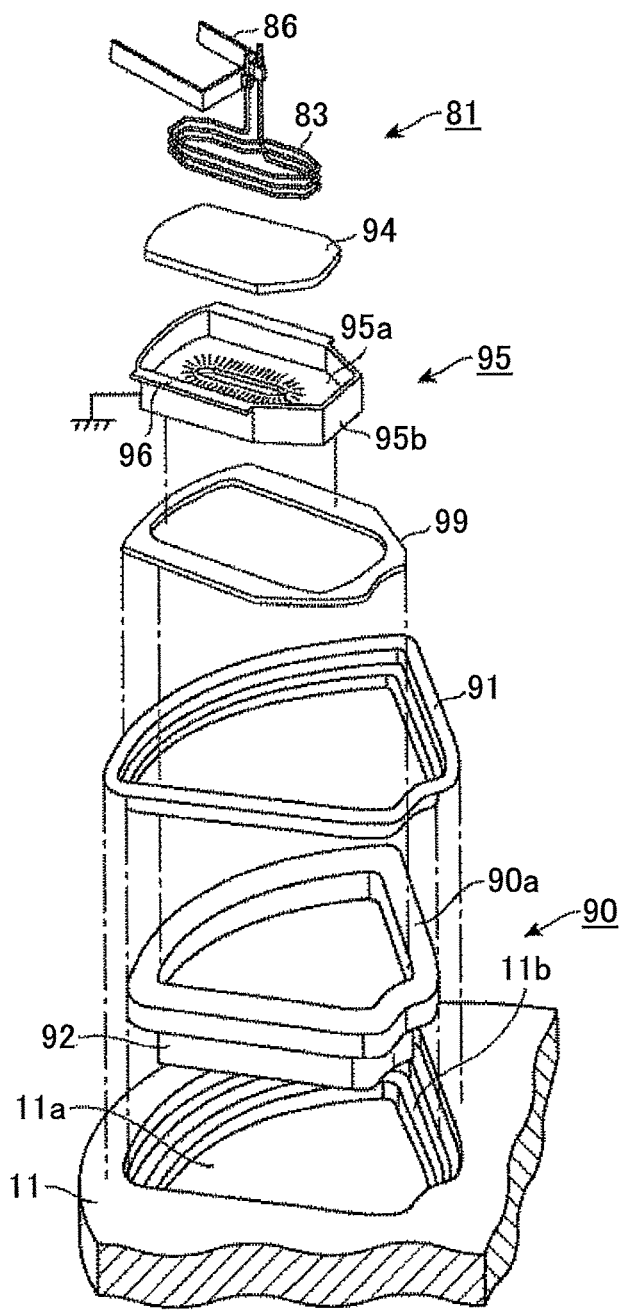
FIG. 5 is an exploded perspective view illustrating an example of the plasma generator of the film deposition apparatus of the embodiment.
Figure 6:
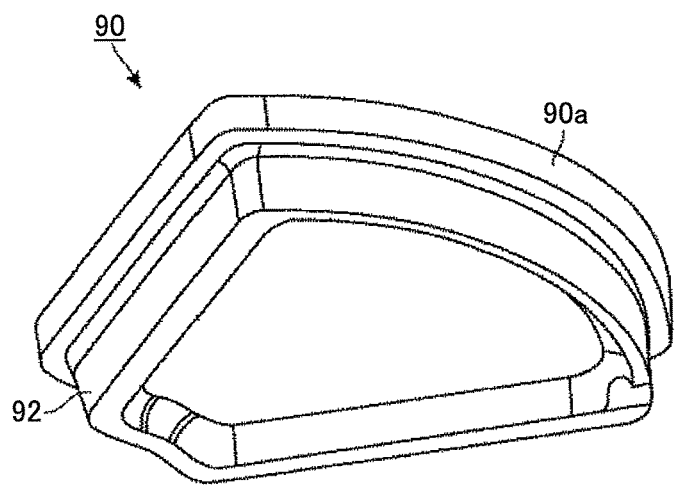
FIG. 6 is a perspective view illustrating an example of a housing provided in the plasma generator of the film deposition apparatus of the embodiment.
Figure 9:
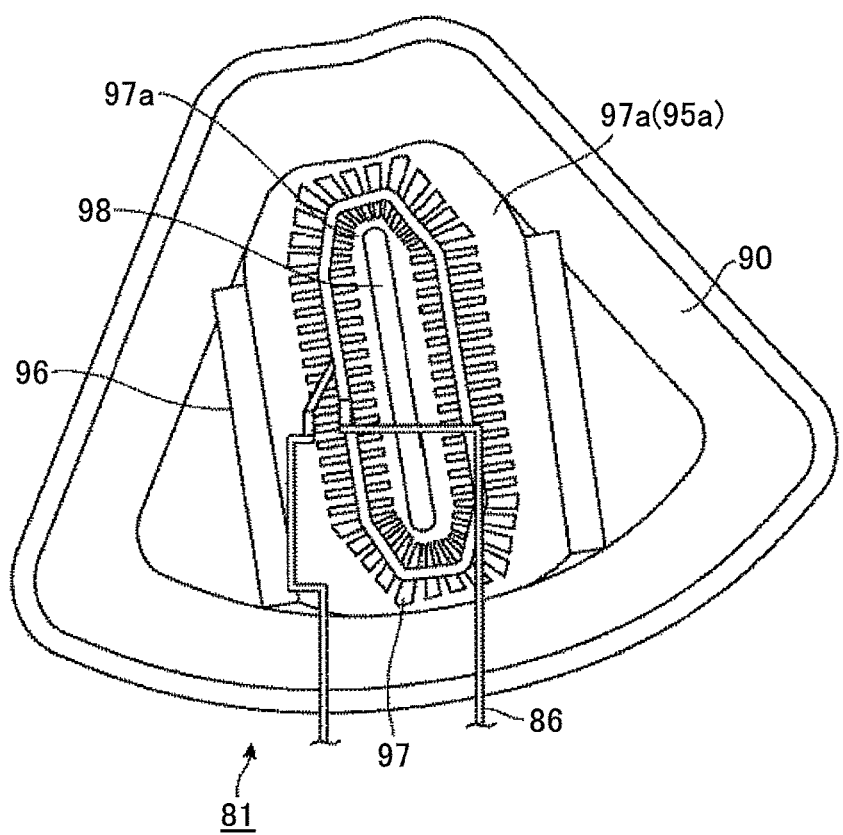
FIG. 9 is a plan view illustrating an example of the plasma generator of the film deposition apparatus of the embodiment.
Figure 10:
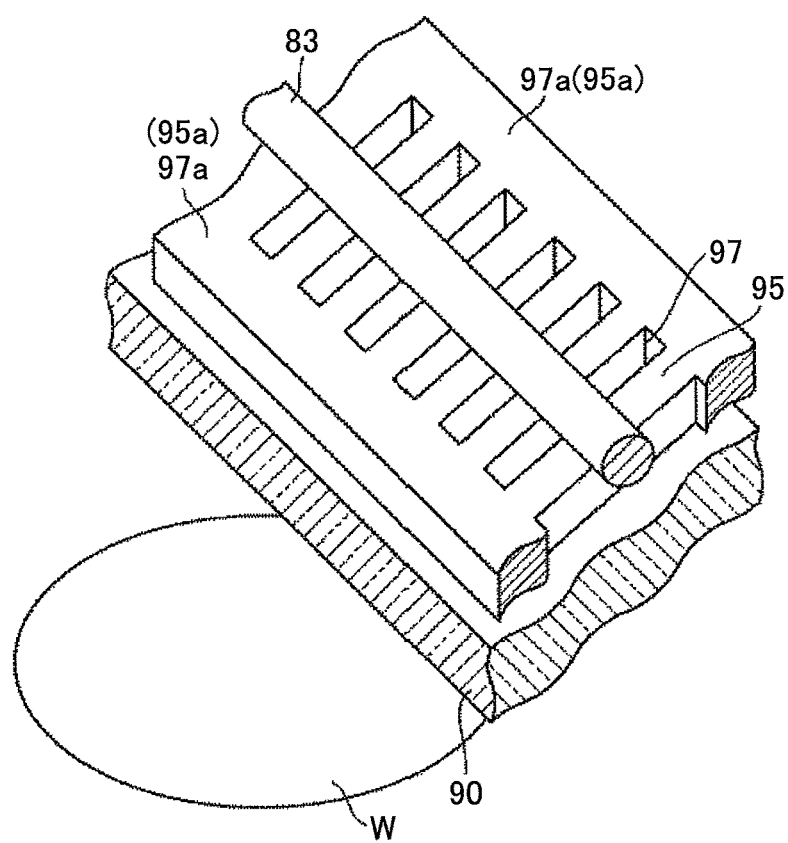
FIG. 10 is a perspective view illustrating an example of a part of a Faraday shield provided in the plasma generator of the film deposition apparatus of the embodiment.

Next, a structure of the plasma generator 81 is described. FIG. 4 is a vertical cross-sectional view illustrating an example of a plasma generator 81 of the film deposition apparatus of the embodiment. FIG. 5 is an exploded perspective view illustrating an example of the plasma generator 81 of the film deposition apparatus of the embodiment. FIG. 6 is a perspective view illustrating an example of the housing 90 provided in the plasma generator 81 of the film deposition apparatus of the embodiment. FIG. 9 is a plan view illustrating an example of the plasma generator 81 of the film deposition apparatus of the embodiment, and FIG. 10 is a perspective view illustrating an example of a part of a Faraday shield 95 provided in the plasma generator 81 of the film deposition apparatus of the embodiment.

The plasma generator 81 is configured by winding an antenna 83 made of a metal wire or the like, for example, three times around a vertical axis in a coil form. In a plan view, the plasma generator 81 is disposed to surround a strip-shaped area extending in the radial direction of the turntable 2 and to extend across the diameter of the wafer W on the turntable 2.

As illustrated in FIG. 1 and FIG. 2, the antenna 83 is connected through a matching box 84 to a high frequency power source 85 that has, for example, a frequency of 13.56 MHz and output power of 4000 W. The antenna 83 is hermetically separated from the inner area of the vacuum chamber 1. The antenna 83, the matching box 84 and the high frequency power source 85 are electrically connected through a connection electrode 86.

As illustrated in FIG. 4 and FIG. 5, an opening 11a having an approximately sectorial shape in a plan view is formed in the top plate 11 above the plasma processing gas nozzles 33 to 35. Three step portions 11b, for example, are formed along a circumferential direction at the opening 11a such that the opening diameter of the opening 11a becomes step-wisely smaller from the upper side to the lower side of the top plate 11. As illustrated in FIG. 4, a seal member 11c is provided along a circumferential direction at an upper surface of the lowest step portion 11b among these step portions 11b. Here, the seal member 11c is not illustrated in FIG. 5.

As illustrated in FIG. 4, the housing 90 made of a dielectric material such as quartz, for example, is provided in the opening 11a so that the antenna 83 is positioned lower than the top plate 11. A bottom surface of the housing 90 configures a ceiling surface 46 of the plasma process area P3.

As illustrated in FIG. 6, an upper peripheral portion surrounding the entire circumference of the housing 90 extends horizontally to form a flange part 90a. Moreover, a central part of the housing 90 in a plan view is recessed toward the inner area of the vacuum chamber 1.

The housing 90 is arranged so as to extend across the diameter of the wafer W in the radial direction of the turntable 2 when the wafer W is located under the housing 90.

The housing 90 is hermetically attached to the vacuum chamber 1. Specifically, the housing 90 is placed in the opening 11a, and the circumference of the housing 90 is pressed downward by a frame-shaped pressing member 91 that is provided on the upper surface of the housing 90 to extend along a contact region of the housing 90. Further, the pressing member 91 is fixed to the top plate 11 by bolts (not illustrated in the drawing) or the like. With this, the internal atmosphere of the vacuum chamber 1 is sealed hermetically.

As illustrated in FIG. 6, the housing 90 includes a protrusion 92 formed at its lower surface to surround the plasma process area P3 below the housing 90 along the circumferential direction. The protrusion 92 vertically extends toward the turntable 2. The above described plasma processing gas nozzles 33 to 35 are housed in an area surrounded by an inner circumferential surface of the protrusion 92, the lower surface of the housing 90 and an upper surface of the turntable 2. A part of the protrusion 92 near a base end (at the inner wall of the vacuum chamber 1) of each of the plasma processing gas nozzles 33 to 35 is cut off to form an arc-shaped cut-out that conforms to the outer shape of each of the plasma processing gas nozzles 33 to 35.

As illustrated in FIG. 4, the protrusion 92 is formed along the circumference of the housing 90 at the lower side (plasma process area P3) of the housing 90. The protrusion 92 prevents the seal member 11c from being directly exposed to plasma, i.e., isolates the seal member 11c from the plasma process area P3. This causes the plasma to pass through an area under the protrusion 92 even when the plasma spreads from the plasma process area P3 toward the seal member 11c, thereby deactivating the plasma before reaching the seal member 11c.

A grounded Faraday shield 95 is provided on the upper side of the housing. The Faraday shield 95 is composed of a conductive plate-like part such as a metal plate (e.g., copper plate) that is shaped to roughly conform to the internal shape of the housing 90. The Faraday shield 95 includes a horizontal surface 95a that extends horizontally along the bottom surface of the housing 90, and a vertical surface 95b that extends upward from the outer edge of the horizontal surface 95a along the circumferential direction. The Faraday shield 95 may be configured to be, for example, a substantially hexagonal shape in a plan view.

When seen from the rotational center of the turntable 2, the right and left upper ends of the Faraday shield 95 extend horizontally rightward and leftward, respectively, to form support portions 96. A frame 99 is provided between the Faraday shield 95 and the housing 90 to support the support portions 96 from below. The frame 99 is supported by a part of the housing 90 near the central area C and a part of the flange part 90a near the outer edge of the turntable 2.

When an electric field reaches the wafer W, electric wirings and the like formed inside the wafer W may be electrically damaged. Thus, as illustrated in FIG. 10, a plurality of slits 97 are formed in the horizontal surface 95a for preventing an electric-field component of an electric field and a magnetic field (electromagnetic field) generated by the antenna 83 from reaching the wafer W and allowing a magnetic field component of the electromagnetic field to reach the wafer W.

As illustrated in FIGS. 9 and 10, the slits 97 are formed along the circumferential direction such that to extend in a direction orthogonal to a winding direction of the antenna 83 below the antenna 83. The width of each slit 97 is set at a value that is about 1/10000 or less of the wavelength of a high frequency supplied to the antenna 83. Electrically-conducting paths 97a made of, for example, a grounded conductor are provided at the ends in the length direction of the slits 97 to close the open ends of the slits 97. An opening 98 is formed in an area of the Faraday shield 95 where the slits 97 are not formed, i.e., an area surrounded by the antenna 83. The opening 98 is used to check whether the plasma is emitting light. In FIG. 2, the slits 97 are omitted for simplification, but an area where the slits 97 are formed is indicated by a dashed-dotted line.

As illustrated in FIG. 5, an insulating plate 94 is stacked on the horizontal surface 95a of the Faraday shield 95. The insulating plate 94 is made of, for example, quartz having a thickness of about 2 mm, and is used for insulation between the Faraday shield 95 and the plasma generator 81 disposed above the Faraday shield 95. Thus, the plasma generator 81 is arranged to cover the inside of the vacuum chamber 1 (i.e., the wafers W on the turntable 2) through the housing 90, the Faraday shield 95 and the insulating plate 94.

Figure 7:
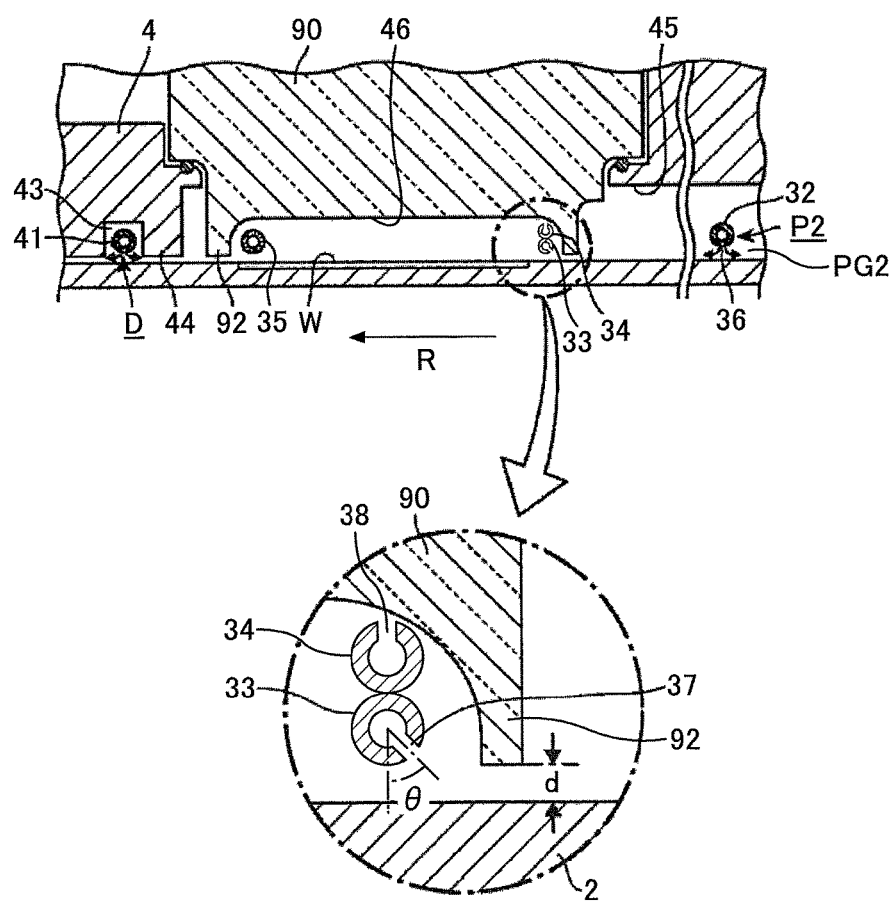
FIG. 7 is a vertical cross-sectional view illustrating an example of a vacuum chamber of the film deposition apparatus of the embodiment taken along a rotational direction of the turntable.
Figure 8:
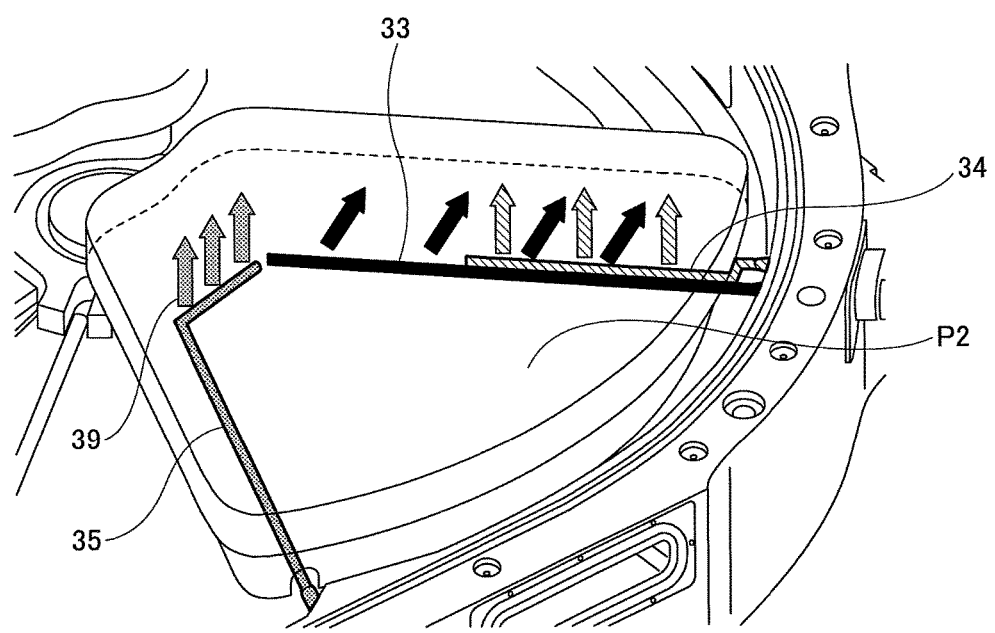
FIG. 8 is a perspective view illustrating an example of plasma processing gas nozzles provided in a plasma process area of the film deposition apparatus of the embodiment in an enlarged manner.

Next, the plasma processing gas nozzles 33 to 35 are described. FIG. 7 is a vertical cross-sectional view illustrating an example of the vacuum chamber 1 of the film deposition apparatus of the embodiment taken along the rotational direction R of the turntable. FIG. 8 is a perspective view illustrating an example of the plasma processing gas nozzles 33 to 35 provided in the plasma process area P3 of the film deposition apparatus of the embodiment in an enlarged manner.

As illustrated in FIG. 8, the base nozzle 33 is provided to cover the entirety of the concave portion 24 on which the wafer W is mounted in the radial direction of the turntable 2 so that the first plasma processing gas PLG1 can be supplied to the entirety of the wafer W. The base nozzle 33 supplies the first plasma processing gas PLG1 such that a flow of the first plasma processing gas PLG1 in a predetermined direction parallel to the surface of the wafer W is formed over the entirety of the wafer W. As the first plasma processing gas PLG1, Ar gas or a mixed gas of Ar gas and oxygen ($O_2$) gas (hereinafter, referred to as Ar/$O_2$ gas) may be used, for example.

As illustrated in FIG. 7, when performing a film deposition process, the turntable 2 is rotated in a clockwise fashion (in the rotational direction R). Thus, the second process gas PG2 discharged from the second process gas nozzle 32 in the second process area P2 tries to come into an area below the housing 90 from a space d between the turntable 2 and the protrusion 92 in accordance with the rotation of the turntable 2. Therefore, in order to prevent the second process gas PG2 enter into the area below the housing 90 from the space d, the base nozzle 33 is configured to discharge the first plasma processing gas PLG1 toward the space d of the protrusion 92 that constitutes a side surface partitioning the plasma process area P3. Specifically, as illustrated in FIG. 4 and FIG. 7, the gas discharge holes 37 of the base nozzle 33 are positioned to face the space d, in other words, such that to face toward the upstream side of the rotational direction R of the turntable 2 and also downward. The angle θ of the direction of the gas discharge holes 37 of the base nozzle 33 with respect to a vertical axis may be about 45° as illustrated in FIG. 7, or may be about 90° so that the gas discharge holes 37 face the inside surface of the protrusion 92, for example. This means that the angle θ of the gas discharge holes 37 may be arbitrarily set in accordance with its purpose within a range between about 45° to 90° at which the entrance of the second process gas PG2 can be appropriately prevented.

The outer nozzle 34 selectively supplies the third plasma processing gas PLG3 at an outer wall side area (outer circumference area) of the vacuum chamber 1 on the plane surface of the wafer W. The outer nozzle 34 is provided to substantially overlap the base nozzle 33 above the base nozzle 33, and has a length that is about a half of the base nozzle 33. The outer nozzle 34 discharges the third plasma processing gas PLG3 toward the ceiling surface 46 of the plasma process area P3, for example. Thus, the outer nozzle 34 is provided with gas discharge holes 38 that face the ceiling surface 46, for example. The outer nozzle 34 is provided, for a case in which non-uniformity is generated in a plasma process by the first plasma processing gas PLG1 supplied from the base nozzle 33, to suppress the non-uniformity. As the third plasma processing gas PLG3, the gas similar to the first plasma processing gas PLG1 may be used. Specifically, as the third plasma processing gas PLG3, Ar gas or $Ar/O_2$ gas may be used, for example.

The axis-side nozzle 35 supplies the second plasma processing gas PLG2 at an upstream side of the flow of the first plasma processing gas PLG1 supplied from the base nozzle 33 in the direction parallel to the surface of the wafer W. The axis-side nozzle 35 is provided to extend from the outer wall of the vacuum chamber 1 in a radius direction of the turntable 2 along a downstream side of the sectorial-shaped plasma process area P3 in the rotational direction and bend near the central area C in a counterclockwise fashion (opposite direction of the rotational direction R of the turntable 2) to further extend linearly along the central area C.

The axis-side nozzle 35 selectively supplies the second plasma processing gas PLG2 at a central area C side area (center side area) of the vacuum chamber 1 on the plane surface of the wafer W. Thus, the gas discharge holes 39 (see FIG. 8) are only formed at a part at a front end of the axis-side nozzle 35 along the central area C, and configured to supply the second plasma processing gas PLG2 at an area of the wafer W near the axis side of the turntable 2. Although the direction of the gas discharge holes 39 of the axis-side nozzle 35 is not specifically limited, similar to the outer nozzle 34, the gas discharge holes 39 may be configured to face toward the ceiling surface 46, for example. As the second plasma processing gas PLG2, a gas containing hydrogen containing gas may be used, and a mixed gas in which a slight amount of hydrogen ($H_2$) gas is added to Ar gas (hereinafter, referred to as $Ar/H_2$ gas) may be used, for example. Effects of the second plasma processing gas PLG2 supplied from the axis-side nozzle 35 are described later in detail.

(Film Deposition Method)

An operation of the film deposition apparatus of the embodiment (film deposition method) is described. The film deposition method of the embodiment includes an adsorption step, an oxidation step and a modification step, and is a method of forming a predetermined film on a surface of the wafer W by repeating these steps.

In the adsorption step, the first process gas PG1 capable being adsorbed to the OH groups is supplied to the surface of the wafer W, and the first process gas PG1 is adsorbed to the surface of the wafer W. In the oxidation step, the second process gas PG2 is supplied to the wafer W to which the first process gas PG1 is adsorbed so that the first process gas PG1 and the second process gas PG2 are reacted to generate a reaction product.

In the modification step, the plasma processing gasses PLG1 to PLG3 are supplied to the wafer W after being plasma activated, and the surface of the reaction product is modified. Then, in the modification step of the embodiment, the first plasma processing gas PLG1 is supplied to form a flow in a direction parallel to the surface of the wafer W over an entire surface of the wafer W, and at the same time, the second plasma processing gas PLG2 containing the hydrogen containing gas is supplied to an supplied at an upstream side of the flow of the first plasma processing gas PLG1 in the direction parallel to the surface of the wafer W. With this, the OH groups generated by the hydrogen containing gas can be selectively adsorbed at the upstream side of the flow of the first plasma processing gas PLG1 at which the adsorbed amount of the OH groups is small on the surface of the reaction product. Thus, even if the OH groups adsorbed to the surface of the reaction product are removed by the plasma in the modification step, the OH groups generated by the hydrogen containing gas can be adsorbed to the surface of the reaction product again. As a result, the distribution of the adsorbed amount of the OH groups on the surface of the wafer W can be made uniform, and molecules of the first process gas PG1 adsorb substantially uniform to the surface of the reaction product. Thus, the thickness of the film formed by the reaction product, obtained by being oxidized by the second process gas PG2, can be made uniform over the entire surface of the wafer W.

Each of the steps of the film deposition method of the embodiment is specifically described in the following. In the following description, an example is described in which organic aminosilane gas is used as the first process gas PG1, ozone ($O_3$) gas is used as the second process gas PG2, $Ar/O_2$ gas is used as the first plasma processing gas PLG1, $Ar/H_2$ gas is used as the second plasma processing gas PLG2, Ar gas is used as the third plasma processing gas PLG3, and a silicon oxide film is formed on the surface of the wafer W.

First, the gate valve G is opened and the wafer W is passed into the concave portion 24 of the turntable 2 through the transfer opening 15 by the transfer arm 10 from outside. The wafer W is passed into the concave portion 24 when the concave portion 24 is intermitted at a position facing the transfer opening 15 and the lifting pins (not illustrated in the drawings) are raised from the bottom of the vacuum chamber 1 through the through holes at the bottom of the concave portion 24. Such passing over of the wafers W are performed while intermittently rotating the turntable 2 to place the wafers W in the six concave portions 24 of the turntable 2, respectively.

Subsequently, after the gate valve G is closed and the pressure in the vacuum chamber 1 is adjusted to a predetermined pressure value by the vacuum pump 64, $N_2$ gas as the separation gas SG is discharged from the separation gas nozzles 41 and 42 at a predetermined flow rate, respectively. Further, $N_2$ gas as the separation gas SG is discharged from the separation gas supply pipe 51, and the purge gas supply pipes 72 and 73 at a predetermined flow rate, respectively. With this, the vacuum chamber 1 is controlled to a previously set process pressure (2 Torr, for example) by the pressure controller 65. Next, the wafers W are heated to 400° C., for example, by the heater unit 7 while rotating the turntable 2 in a clockwise fashion at a rotation speed of 5 rpm, for example.

Subsequently, organic aminosilane gas is supplied from the first process gas nozzle 31, and $O_3$ gas is supplied from the second process gas nozzle 32. Further, $Ar/O_2$ gas is supplied from the base nozzle 33, Ar gas is supplied from the outer nozzle 34, $Ar/H_2$ gas is supplied from the axis-side nozzle 35, and high frequency with a frequency of 13.56 MHz and output power of 4000 W is supplied to the antenna 83 of the plasma generator 81. With this, plasma is generated in the plasma process area P3. Active species such as oxygen ions or oxygen radicals, or high energy particles are generated in the plasma.

The wafer W passes through the first process area P1, the separation area D, the second process area P2, the plasma process area P3 and the separation area D in this order by the rotation of the turntable 2. At this time, molecules of the organic aminosilane gas adsorb to the surface of the wafer W in the first process area P1, and a molecular layer of organic aminosilane is formed (adsorption step). After passing through the separation area D, the organic aminosilane gas adsorbed to the surface of the wafer W is oxidized by $O_3$ gas molecular in the second process area P2, and one or more of molecular layers of silicon oxide film is formed to form a reaction product (oxidation step). When the organic aminosilane gas is oxidized, hydroxyl groups (OH groups) are generated as a by-product, and the generated OH groups adsorb to the surface of the silicon oxide film.

Subsequently, when the wafer W passes through the plasma process area P3, the silicon oxide film is exposed to the plasma, and the surface of the silicon oxide film is modified (modification step). At this time, a part of the OH groups adsorbed to the silicon oxide film is removed from the surface of the silicon oxide film by the collision of the high energy particles in the plasma, for example. At this time, the $Ar/O_2$ gas supplied from the base nozzle 33 flows toward the second exhaust opening 62. In other words, the $Ar/O_2$ gas supplied from the base nozzle 33 flows from the center side area toward the outer circumference area.

Figure 11:
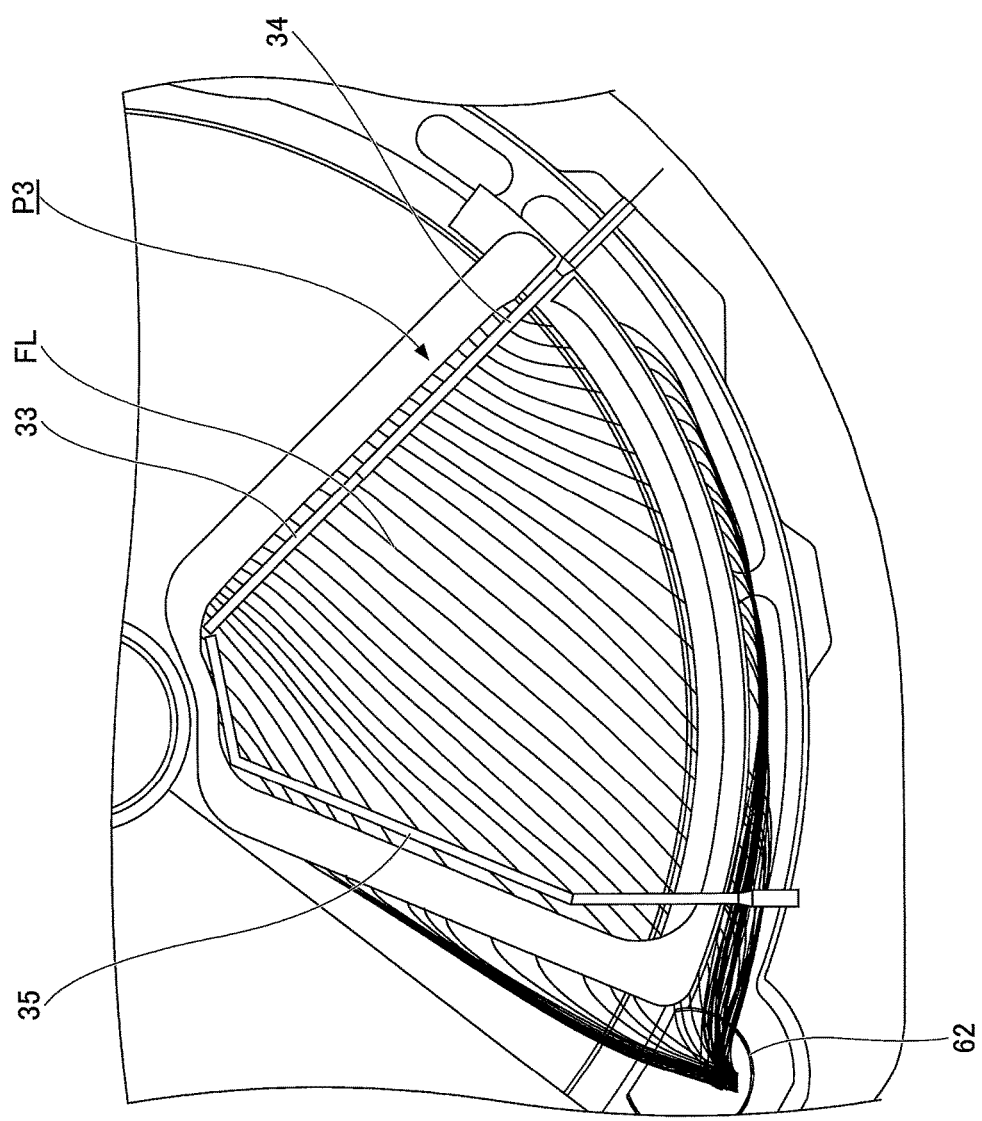
FIG. 11 is a plan view illustrating a simulation result of a flow of a plasma processing gas in the plasma process area of the film deposition apparatus of the embodiment.

The flow FL of the plasma processing gas in the plasma process area P3 of the film deposition apparatus of the embodiment is described with reference to FIG. 11. FIG. 11 is a plan view illustrating a simulation result of the flow FL of the plasma processing gas in the plasma process area of the film deposition apparatus of the embodiment.

In this simulation, the pressure in the vacuum chamber 1 was 2 Torr ($2.7 \times 10^2$ Pa), the heating temperature by the heater unit 7 was 400° C., the rotation speed of the turntable 2 was 5 rpm, the flow rate of $Ar/O_2$ gas supplied from the base nozzle 33 was 14.8 slm/75 sccm, the flow rate of Ar gas supplied from the outer nozzle 34 was 0.1 slm, and the flow rate of Ar gas supplied from the axis-side nozzle 35 was 0.1 slm.

As illustrated in FIG. 11, it can be understood that $Ar/O_2$ gas supplied from the base nozzle 33 is aspirated into the second exhaust opening 62 that is provided at the downstream side of the plasma process area P3 at the outer circumference of the turntable 2. Due to this, the OH groups removed from the silicon oxide film diffuse toward the outer circumference of the turntable 2 along the flow of the gas. Then, a part of the OH groups adsorbs to the surface of the silicon oxide film again at an area near the outer circumference. Thus, the OH groups are distributed such that the density of the OH groups at the outer circumference side area becomes higher than the density of the OH groups at the center side area, over the entire surface of the wafer W. In other words, the adsorbed amount of the OH groups at the surface of the silicon oxide film formed on the surface of the wafer W becomes non-uniform.

Thus, according to the embodiment, by supplying the $Ar/H_2$ gas from the axis-side nozzle 35 in the modification step, the OH groups generated by $H_2$ gas can be selectively adsorbed at the center side area, at which the adsorbed amount of the OH groups is small, at the surface of the silicon oxide film. With this, even if the OH groups adsorbed to the surface of the silicon oxide film in the oxidation step are removed by the plasma in the modification step, the OH groups generated by $H_2$ gas are selectively adsorbed to the surface of the silicon oxide film at the center side area again. As a result, the distribution of the adsorbed amount of the OH groups in the in-plane of the wafer W can be made uniform. Further, by adjusting the ratio of the $H_2$ gas in the $Ar/H_2$ gas, the distribution of the adsorbed amount of the OH groups in the in-plane of the wafer W can be controlled.

Subsequently, when the wafer W passes through the first process area P1 again by the rotation of the turntable 2, molecules of the organic aminosilane gas supplied from the first process gas nozzle 31 adsorb to the surface of the wafer W. At this time, as the molecules of the organic aminosilane gas easily adsorb to the OH groups, the molecules of the organic aminosilane gas adsorb to the surface of the silicon oxide film in accordance with the distribution of the OH groups. In this embodiment, as the distribution of the OH groups in the in-plane of the wafer W is made uniform in the modification step, the molecules of the organic aminosilane gas substantially uniformly adsorb to the surface of the silicon oxide film.

Subsequently, when the wafer W passes through the second process area P2, the organic aminosilane gas adsorbed to the surface of the silicon oxide film is oxidized by $O_3$ gas, and one or a plurality of layers of a molecular layer of a silicon oxide film are further formed so that a reaction product is formed. At this time, as the film thickness distribution of the silicon oxide film reflects the density of the organic aminosilane gas adsorbed to the surface of the silicon oxide film, the silicon oxide film is uniformly formed over the entire surface of the wafer W. At this time, OH groups generated by the oxidization of the organic aminosilane gas adsorb to the surface of the silicon oxide film.

Subsequently, when the wafer W passes through the plasma process area P3 again, as described above, the OH groups are uniformly distributed over the entire surface of the wafer W.

Thereafter, by repeating the above described adsorption step, the oxidation step and the modification step in this order, the silicon oxide film having a predetermined thickness is formed on the surface of the wafer W.

The mechanism of the film deposition method of the embodiment is further described with reference to FIG. 11. In this embodiment, the base nozzle 33 is provided to cover the entirety of the concave portion 24, on which the wafer W is mounted, in the radial direction of the turntable 2, and the gas discharge holes 37 are provided at the entirety of the concave portion 24, on which the wafer W is mounted, in the radial direction of the turntable 2. Thus, $Ar/O_2$ gas (first plasma processing gas PL1) supplied from the base nozzle 33 forms a flow in a direction parallel to the surface of the wafer W over the entire surface of the wafer W. Here, the second exhaust opening 62 is provided at a border portion of the plasma process area P3 with the separation area D at the outer circumference of the turntable 2 (at the downstream side of the plasma process area P3 in the rotational direction R, at left and lower side in the drawing). Thus, $Ar/O_2$ gas flows in a direction from the base nozzle 33 toward the second exhaust opening 62, in particular, from the center area toward the outer circumference area. At this time, in particular, the density of the OH groups becomes low at the upstream side of the flow of the $Ar/O_2$ gas, in other words, at the center side area. Thus, in this embodiment, $Ar/H_2$ gas containing the hydrogen containing gas capable of generating the OH groups are supplied from the axis-side nozzle 35 at the upstream side of the flow of the $Ar/O_2$ gas supplied from the base nozzle 33, in other words, at the center side area. With this configuration, distribution of the adsorbed amount of the OH groups over the surface of the wafer W can be made uniform.

As described above, according to the film deposition method of the embodiment, by providing $Ar/H_2$ gas from the axis-side nozzle 35 in the modification step, the OH groups generated by $H_2$ gas are selectively adsorbed at the center side area, at which the adsorbed amount of the OH groups is small, at the surface of the silicon oxide film. With this, even if the OH groups adsorbed to the surface of the silicon oxide film in the oxidation step are removed by the plasma in the modification step, the OH groups generated by $H_2$ gas selectively adsorb to the surface of the silicon oxide film at the center side area again. As a result, the distribution of the adsorbed amount of the OH groups over the in-plane of the wafer W can be made uniform. Thus, the molecules of organic aminosilane gas substantially uniformly adsorb to the surface of the silicon oxide film and are oxidized by $O_3$ gas. Therefore, in-plane uniformity of the thickness of the silicon oxide film is improved.

EXAMPLE

Although the film deposition method of the embodiment using the above described film deposition apparatus is specifically described in the following as an example, the present invention should not be interpreted as being limited to such an example.

In this example, $Ar/H_2$ gas was used as the second plasma processing gas PLG2 supplied from the axis-side nozzle 35, and influence of the flow rate of $H_2$ gas of $Ar/H_2$ gas to the film thickness distribution of the silicon oxide film formed on the surface of the wafer W was evaluated. A silicon wafer on which a thermal oxide film was formed at a surface was used as the wafer W. Specifically, the flow rate of Ar gas of $Ar/H_2$ gas supplied from the axis-side nozzle 35 was set to be 1 slm, and the flow rate of $H_2$ gas of $Ar/H_2$ gas was controlled to be 0 sccm, 0.2 sccm, 0.5 sccm and 1.0 sccm. The film deposition conditions other than the second plasma processing gas PLG2 are as follows.

First process gas PG1: organic aminosilane gas
Second process gas PG2: $O_3$ gas
First plasma processing gas PLG1: $Ar/O_2$=13 slm/75 sccm
Third plasma processing gas PLG3: Ar=1 slm
Rotation speed of turntable: 5 rpm
High frequency power: 4000 W
Heating temperature: 400° C.
Pressure: 2 Torr ($2.7 \times 10^2$ Pa)

Figure 12:
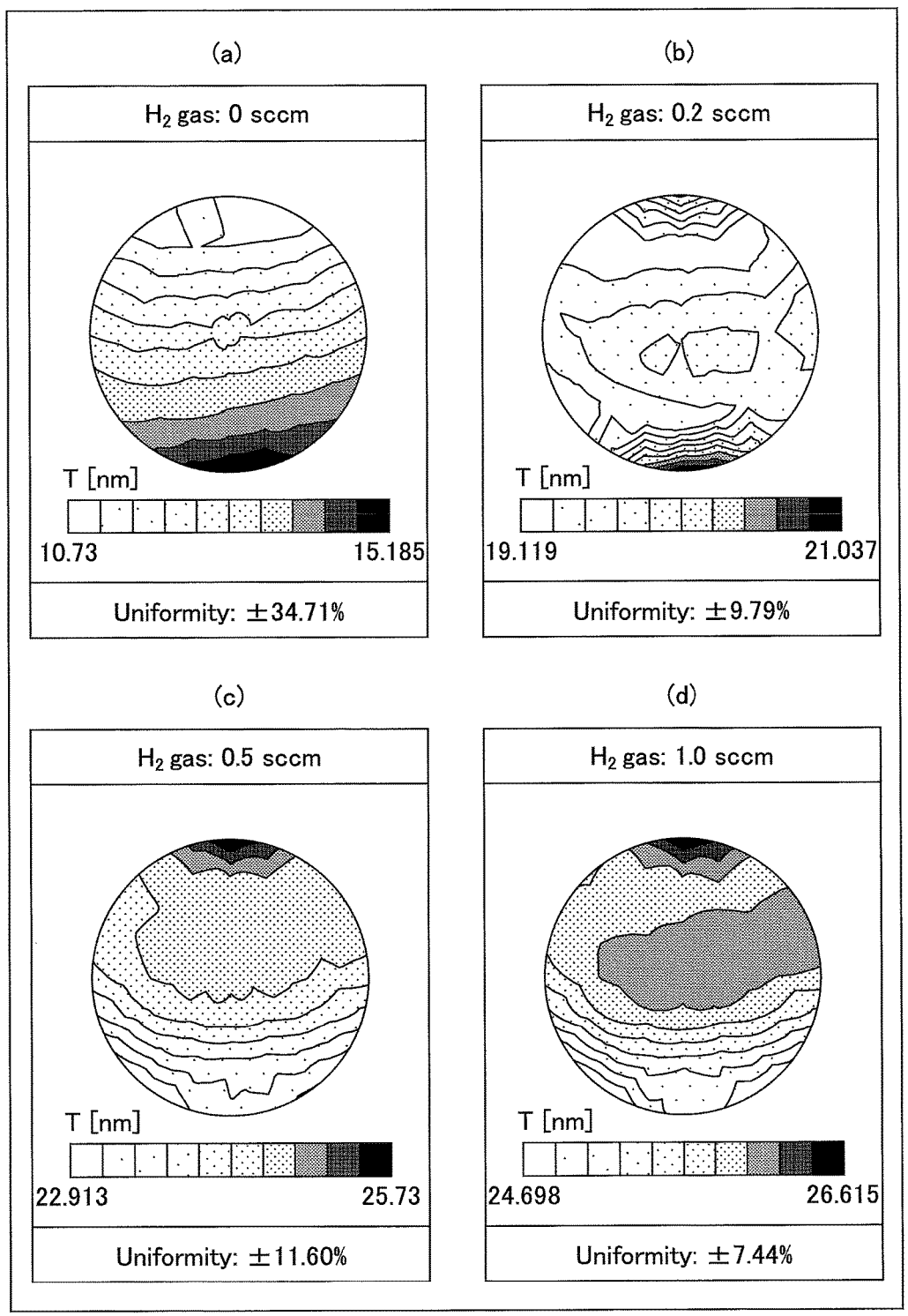
FIG. 12 is a view for describing effects of a film deposition method of the embodiment.

FIG. 12 is a view for describing effects of the film deposition method of the embodiment. FIG. 12 illustrates $H_2$ gas flow rate dependency of the distribution of the thickness (T) of the silicon oxide film formed on the surface of the wafer W over the entire surface of the wafer W and in-plane uniformity. In FIG. 12, (a), (b), (c) and (d) correspond to the flow rate of $H_2$ gas of 0 sccm, 0.2 sccm, 0.5 sccm and 1.0 sccm, respectively, and illustrate the distribution of the thickness of the silicon oxide film formed on the surface of the wafer W and the in-plane uniformity.

In the views illustrating the distribution of the thickness in FIG. 12, the upper side expresses the area at the central area C side (center side area) and the lower side expresses the area at the outer wall side (outer circumference area) of the vacuum chamber 1. Further, the in-plane uniformity of the thickness (Uniformity) [%] in FIG. 12 is obtained by measuring the maximum thickness [nm] and the minimum thickness [nm] of the entire surface of each of the six wafers W, calculating the in-plane uniformity of each of the six wafers W by applying the following formula (1), and averaging the obtained values of the six wafers W.

$$\pm((\text{maximum thickness}-\text{minimum thickness})/(\text{maximum thickness}+\text{minimum thickness}))\times 100 \quad (1)$$

As illustrated in (a) of FIG. 12, for a case when $H_2$ gas is not added (flow rate of $H_2$ gas is 0 sccm), the thickness of the silicon oxide film increases from the center side area toward the outer circumference area, and the in-plane uniformity of the thickness is ±34.71%. It can be considered that the OH groups are distributed such that the density of the OH groups is higher at the outer circumference area of the wafer W than the density of the OH groups at the center side area in the modification step.

On the other hand, as illustrated in (b) to (d) of FIG. 12, it can be understood that the thickness of the silicon oxide film at the center side area is increased by adding $H_2$ gas. Further, as illustrated in (c) and (d) of FIG. 12, in accordance with the increase of the flow rate of $H_2$ gas, the distribution of the thickness is changed such that the thickness of the silicon oxide film is decreased from the center side area toward the outer circumference area. In this example, the in-plane uniformity of the thickness of the silicon oxide film for the cases when the flow rate of $H_2$ gas were 0.2 sccm, 0.5 sccm and 1.0 sccm, were ±9.79%, ±11.60% and 7.44%, respectively. This means that the uniformity of the thickness of the silicon oxide film can be improved compared with the case when $H_2$ gas was not added. It can be considered as follows. By supplying the gas in which $H_2$ gas was added from the axis-side nozzle 35, the OH groups can be selectively adsorbed at the center side area, at which the adsorbed amount of the OH groups was small, at the surface of the silicon oxide film. Then, the distribution of the adsorbed amount of the OH groups can be adjusted to be substantially uniform in the in-plane of the wafer W.

The present invention is not limited to the specifically disclosed embodiments, and numerous variations and modifications may be made without departing from the spirit and scope of the present invention.

Although a preferred embodiment of the film deposition method has been specifically illustrated and described, it is to be understood that minor modifications may be made therein without departing from the spirit and scope of the invention as defined by the claims.

For example, although the plasma generator 81 is described as an Inductively Coupled Plasma (ICP) source including the antenna 83 in the embodiment, this is not limited so. The plasma generator 81 may be a Capacitively Coupled Plasma (CCP) source in which plasma is generated by applying high frequency between two rod electrodes extending in parallel with each other, for example. As the plasma is generated even when the CCP source is used, the same effects as described above can be obtained.

Further, although the silicon oxide film is formed on the surface of the wafer W, on which a pattern including a concave portion is not formed, in this embodiment, this is not limited so. For example, the silicon oxide film may be formed to fill a concave portion of the wafer W on which a pattern including the concave portion is formed such as a trench of a trench device structure, a space of a line-space pattern, a via hole, a trench via or the like. Even when forming the silicon oxide film to fill the concave portion, by supplying the gas to which $H_2$ gas is added from the axis-side nozzle 35, the OH groups can be selectively adsorbed at the center side area of the surface of the silicon oxide film at which the adsorbed amount of the OH groups is small. Thus, the effects similar to the above described embodiment can be obtained.

Further, in this embodiment embodiment, the first process gas supplied from the first process gas nozzle 31 is not limited to the above described organic aminosilane gas as long as the gas can adsorb to the OH group, and may be other silicon containing gas such as organic organosilicon compound gas or the like. Further, the second process gas supplied from the second process gas nozzle 32 is not limited to O₃ gas, and may be other oxide gas such as O₂ gas, a mixed gas of O₂ gas and O₃ gas or the like, for example.

Further, organic metal gas may be supplied from the first process gas nozzle 31 as long as the gas can be adsorbed to the OH group, for example. By supplying the organic metal gas containing zirconium (Zr) from the first process gas nozzle 31 as the organic metal gas, and O₃ gas or the like from the second process gas nozzle 32, for example, a zirconium oxide (ZrO) film can be formed. As the organic metal gas containing Zr, Tetrakis(ethylmethylamino)zirconium (TEMAZ) may be preferably used, for example.

Further, as the organic metal gas, organic metal gas containing aluminum (Al) may be used. An aluminum oxide (AlO) film may be formed by supplying the organic metal gas containing Al from the first process gas nozzle 31, and supplying O₃ gas or the like from the second process gas nozzle 32. As the organic metal gas containing Al, trimethyl aluminum (TMA) or Ethyldimethylamine alane may be preferably used, for example. Further, by complementary supplying the organic metal gas containing Zr and the organic metal gas containing Al from the first process gas nozzle 31, a ZrAlO film can be formed.

Further, as the hydrogen containing gas supplied from the axis-side nozzle 35 into the plasma process area P3 may be any gas that can be adsorbed to the surface of the first process gas and can generate the OH groups, and is not limited to H₂ gas. As the hydrogen containing gas, ammonia (NH₃) gas may be used, for example.

Further, although the structure is described in the above embodiment in which the hydrogen containing gas (second plasma processing gas PL2) is supplied to the plasma process area P3 from the axis-side nozzle 35, the structure of supplying the hydrogen containing gas is not limited to the axis-side nozzle 35. Various structures may be adopted in which the hydrogen containing gas can be supplied to the upstream side of the flow of the first plasma processing gas PL1 in the direction parallel to the surface of the wafer W, in particular, at the area where the density of the OH groups is low, in accordance with a position of the exhaust opening or the like.

According to the disclosed film deposition method, in-plane uniformity of the thickness of a film formed on a substrate can be improved.

What is claimed is:

1. A film deposition method for forming a film of a reaction product of a first process gas and a second process gas by a film deposition apparatus including
    a process chamber that includes a first process area, a first separation area, a second process area, a plasma process area and a second separation area in this order, and
    a turntable provided in the process chamber, a surface of the turntable having a plurality of concave portions for receiving a plurality of substrates, respectively,
    the method comprising: while rotating the turntable around a rotational center of the turntable,
    adsorbing the first process gas onto a hydroxyl group formed on a surface of each of the substrates received in the respective concave portion of the turntable by supplying the first process gas to the surface of said each of the substrates at the first process area;
    reacting the first process gas and the second process gas to generate the reaction product by supplying the second process gas at the second process area, to said each of the substrates onto which the first process gas is adsorbed; and
    modifying a surface of the reaction product, generated on said each of the substrates, at the plasma process area by
    supplying a first plasma processing gas from a first plasma processing gas nozzle provided at the plasma process area to extend from an outer edge of the turntable toward the rotational center of the turntable to supply the first plasma processing gas over an entire surface of said each of the substrates,
    supplying a second plasma processing gas containing hydrogen containing gas from a second plasma processing gas nozzle extending from an outer periphery of the process chamber to the rotational center of the turntable and having a bent portion formed by being bent in a direction opposite to a rotation direction of the turntable at a vicinity of the rotational center of the turntable, said second plasma processing gas nozzle being provided at an upstream side of the turntable with respect to the first plasma processing gas nozzle in a direction of gas flow of the first plasma processing gas, and said bent portion being configured to supply the second plasma processing gas selectively near the rotational center of the turntable but within the plasma process area, and
    plasma activating the first plasma processing gas and the second plasma processing gas at the plasma process area to modify the surface of the reaction product.

2. The film deposition method according to claim 1, wherein the adsorbing the first process gas, the reacting the first process gas and the second process gas, and the modifying the surface of the reaction product are performed in this order, by rotating the turntable.

3. The film deposition method according to claim 1, wherein in the modifying the surface of the reaction product, a hydroxyl group is adsorbed to the surface of the reaction product by supplying the second plasma processing gas from the second plasma processing gas nozzle.

4. The film deposition method according to claim 1, wherein the first process gas is organic aminosilane gas and the second process gas is ozone gas.

5. The film deposition method according to claim 4, wherein the second plasma processing gas contains hydrogen gas and argon gas, and
    wherein the flow rate of the hydrogen gas is less than or equal to $1/1000$ of the flow rate of the argon gas.

6. The film deposition method according to claim 5, wherein the first plasma processing gas is argon gas or a mixed gas of argon gas and oxygen ($O_2$) gas.

7. The film deposition method according to claim 1, wherein a pattern including a concave portion is formed on said each of the substrates, and the film of the reaction product is formed inside the concave portion.

8. The film deposition method according to claim 1, wherein in the modifying the surface of the reaction product, a third plasma processing gas is supplied from a third plasma processing gas nozzle that is selectively provided near the outer edge of the turntable to extend along the radial direction of the turntable.

9. The film deposition method according to claim 8, wherein the first process gas is organic aminosilane gas and the second process gas is ozone gas.

10. The film deposition method according to claim 9, wherein the second plasma processing gas contains hydrogen gas and argon gas, and
    wherein the flow rate of the hydrogen gas is less than or equal to $1/1000$ of the flow rate of the argon gas.

11. The film deposition method according to claim 10, wherein the first plasma processing gas is argon gas or a mixed gas of argon gas and oxygen ($O_2$) gas.

12. The film deposition method according to claim 11, wherein the third plasma processing gas is argon gas or a mixed gas of argon gas and oxygen ($O_2$) gas.

13. The film deposition method according to claim 1, wherein the second plasma processing gas nozzle has a gas discharge hole provided only at the bent portion configured to supply the second plasma processing gas selectively near the rotational center of the turntable.

* * * * *